(12) United States Patent
Lyu et al.

(10) Patent No.: US 8,716,768 B2
(45) Date of Patent: May 6, 2014

(54) TRANSISTOR WITH SELF-ALIGNED CHANNEL WIDTH

(75) Inventors: Jeong-Ho Lyu, San Jose, CA (US); Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 185 days.

(21) Appl. No.: 13/278,038

(22) Filed: Oct. 20, 2011

(65) Prior Publication Data

US 2013/0099296 A1 Apr. 25, 2013

(51) Int. Cl.
*H01L 31/062* (2012.01)
*H01L 31/113* (2006.01)

(52) U.S. Cl.
USPC ............. 257/291; 257/E21.409; 257/E31.085

(58) Field of Classification Search
None
See application file for complete search history.

(56) References Cited

U.S. PATENT DOCUMENTS 6,794,717 B2 * 9/2004 Matsumoto et al. .......... 257/347

OTHER PUBLICATIONS

Oishi, T., et al., "Isolation Edge Effect Depending on Gate Length of MOSFET's with Various Isolation Structures", IEEE Transactions on Electron Devices, vol. 47, No. 4, Apr. 2000, pp. 822-827.

* cited by examiner

*Primary Examiner* — Sonya D McCall Shepard
(74) *Attorney, Agent, or Firm* — Blakely Sokoloff Taylor & Zafman LLP

(57) ABSTRACT

A device includes a transistor including a source and a drain disposed in a substrate and a gate disposed above the substrate. The gate includes a first longitudinal member disposed above the source and the drain and running substantially parallel to a channel of the transistor. The first longitudinal member is disposed over a first junction isolation area. The gate also includes a second longitudinal member disposed above the source and the drain and running substantially parallel to the channel of the transistor. The second longitudinal member is disposed over a second junction isolation region. The gate also includes a cross member running substantially perpendicular to the channel of the transistor and connecting the first longitudinal member to the second longitudinal member. The cross member is disposed above and between the source and the drain.

11 Claims, 10 Drawing Sheets

US 8,716,768 B2

TRANSISTOR WITH SELF-ALIGNED CHANNEL WIDTH

TECHNICAL FIELD

This disclosure relates generally to electronics, and in particular but not exclusively, relates to transistors.

BACKGROUND INFORMATION

Image sensors are widely used in digital still cameras, cellular phones, security cameras, as well as in, medical, automobile, and other applications. Complementary metal-oxide-semiconductor ("CMOS") technology is used to manufacture lower cost image sensors on silicon substrates. In a large number of image sensors, the image sensor commonly includes hundreds, thousand or even millions of light sensor cells or pixels. A typical individual pixel includes a micro-lens, a filter, a photosensitive element, a floating diffusion region, and one or more transistors for reading out a signal from the photosensitive element. As image sensor pixels become smaller and smaller, the transistors inside them must also become smaller. However, conventional transistor technologies encounter isolation challenges and increased manufacturing expenses as the size of the transistors in image pixels shrink.

Shallow Trench Isolation ("STI"), and Local Oxidation of Silicon ("LOCOS") are isolation technologies that are used in image pixels. LOCOS is suitable for image sensors, but it is difficult to reduce the size of the pixel with LOCOS technology. STI generally has less encroachment than LOCOS into the active region of a transistor, and may be chosen instead of LOCOS. However, both technologies create an isolation edge effect where the isolation region meets the active portion of a transistor. The isolation edge effect can negatively influence the electrical characteristics of a transistor. For example, STI may cause white (a.k.a. "hot pixels") or dark pixels. One component of the isolation edge effect is sometimes called the narrow width effect, which increasingly becomes a factor in small-geometry MOSFET design.

Tooling for fabrication becomes more and more expensive as transistors get smaller. Reducing the size of a transistor requires tools with smaller tolerances and these precision tools increase manufacturing cost. A reticle, used in photolithography, is one example of a transistor fabrication tool that requires tighter tolerance. Another byproduct of manufacturing smaller transistors is higher defect rates due to misalignment of transistor structures in the fabrication process.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method of manufacture for a transistor are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
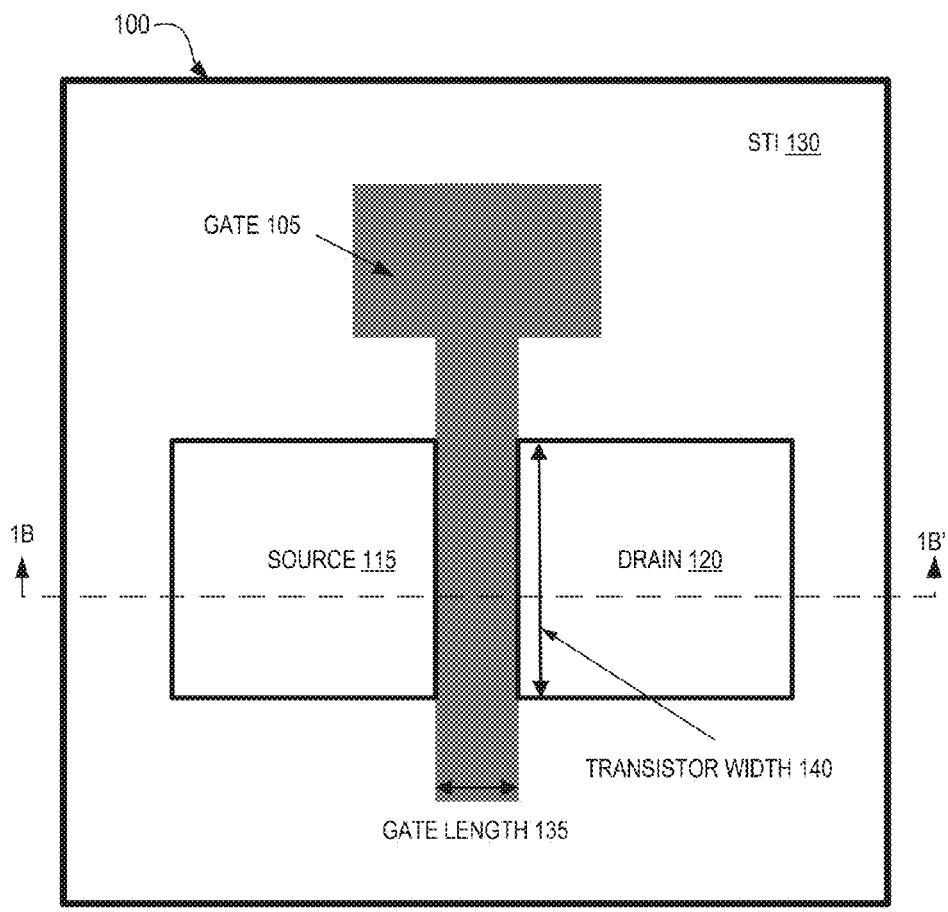
FIG. 1A is a top view of a conventional transistor.
Figure 1B:
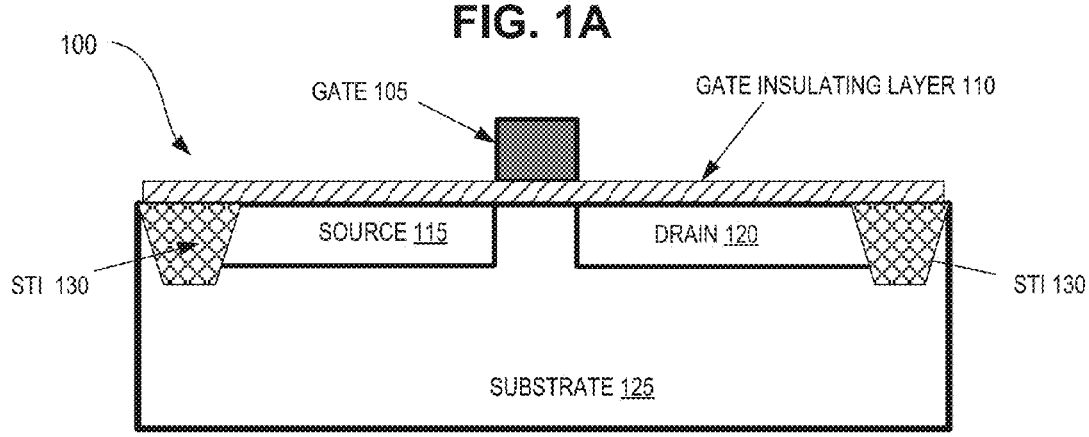
FIG. 1B is a cross sectional view through line 1B-1B' of the conventional transistor in FIG. 1A.

FIG. 1A is a plan view of a conventional transistor and FIG. 1B is a cross sectional view through line 1B-1B' of the conventional transistor in FIG. 1A. Transistor 100 includes gate 105, gate insulating layer 110, source 115, drain 120, substrate 125, and STI 130. Gate length 135 is illustrated as the distance between source 115 and drain 120. Transistor width 140 is illustrated as the width of source 115 or drain 120. Substrate 125 may include an epitaxial layer grown on a substrate. Transistor 100 is turned "on" when a bias voltage on gate 105 reaches a threshold voltage, and a conducting channel (not illustrated) is formed between source 115 and drain 120. STI 130 provides electrical isolation between any adjacent transistors or other adjacent electrical components. Some conventional transistors may use LOCOS rather than STI 130.

Figure 2A:
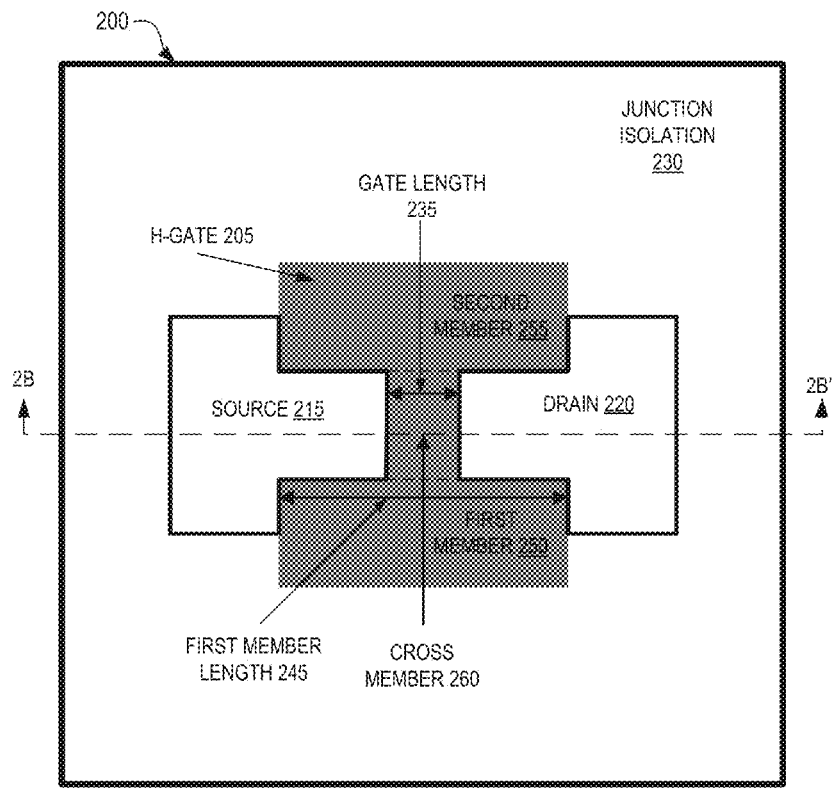
FIG. 2A is a plan view illustrating a transistor, in accordance with an embodiment of the disclosure.
Figure 2B:
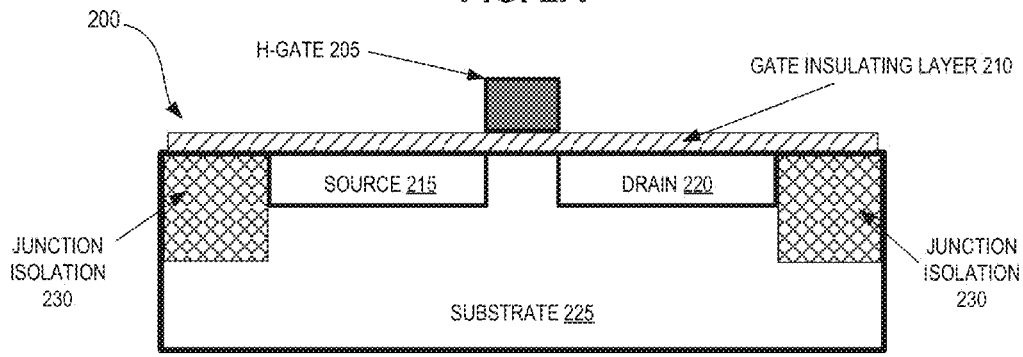
FIG. 2B is a cross sectional view through line 2B-2B' of FIG. 2A illustrating a transistor, in accordance with an embodiment of the disclosure.

FIG. 2A is a plan view illustrating a transistor 200 and FIG. 2B is a cross sectional view through line 2B-2B' of FIG. 2A, in accordance with an embodiment of the disclosure. The illustrated embodiment of transistor 200 includes an H-gate 205, gate insulating layer 210, source 215, drain 220, substrate 225, and junction isolation 230. Transistor 200 is turned "on" when a bias voltage on gate 205 reaches a threshold voltage, and a conducting channel is formed in substrate 225 between source 215 and drain 220. Substrate 225 may include an epitaxial layer grown on a substrate.

The illustrated embodiment of H-gate 205 includes first member 250, second member 255, and cross member 260. H-gate 205 may be made from polysilicon. In the illustrated embodiment, H-gate 205 is made from a continuous piece of polysilicon and first member 250, second member 255, and cross member 260 are illustrated for description purposes. Cross member 260 runs substantially perpendicular to the channel of transistor 200 and connects first member 250 and second member 255. Cross member 260 runs substantially perpendicular to first member 250 and second member 255 and is disposed above and between source 215 and drain 220. Gate length 235 is the distance between source 215 and drain 220 at cross member 260. A width of the channel of transistor 200 is approximately the distance between first member 250 and second member 255. First member 250 and second member 255 in the illustrated embodiment may be extended lengthwise (same direction as gate length 235), as space constraints allow.

In the illustrated embodiment in FIG. 2A, source 215 and drain 220 have a T-shape due to the method of fabrication described below. Those of ordinary skill in the art will recognize that the boundaries for source 215 and drain 220 may expand slightly from the illustrated boundaries due to diffusion. Additionally, if angled implantation methods are utilized, the boundaries of source 215 and drain 220 may be different than illustrated.

Junction Isolation 230 provides electrical isolation between any adjacent transistors or other adjacent electrical components. There are multiple approaches and techniques to junction isolation 230. One approach is to increase the doping levels between transistors. For example, if substrate 225 is P type doped and source 215 and drain 220 are N type doped, additional P type doping would be added to the area surrounding source 215 and drain 220 to isolate transistor 200 from adjacent transistors. In this example, junction isolation 230 may be denoted as P+ and substrate 225 may be denoted as P– to show their relative doping levels. In one embodiment, poly field plate isolation is used in addition to junction isolation 230. In other embodiments, poly field plate isolation is used without junction isolation 230. Using junction isolation 230 avoids transistor damage and stress resulting from etching a trench for STI 130 in substrate 125. STI caused damage (particularly near the corners of the STI) may lead to hot pixels and/or increased dark current.

The shape and placement of H-gate 205 may also reduce undesirable electrical effects including reducing the narrow width effect. For example, the channel of the transistor (which flows substantially under cross member 260), may not flow under the bottom edge of first member 250 or under the top edge of second member 255. Since these edges are offset from the channel, the narrow width effect that is a component of the isolation edge effect may be suppressed.

Figure 3:
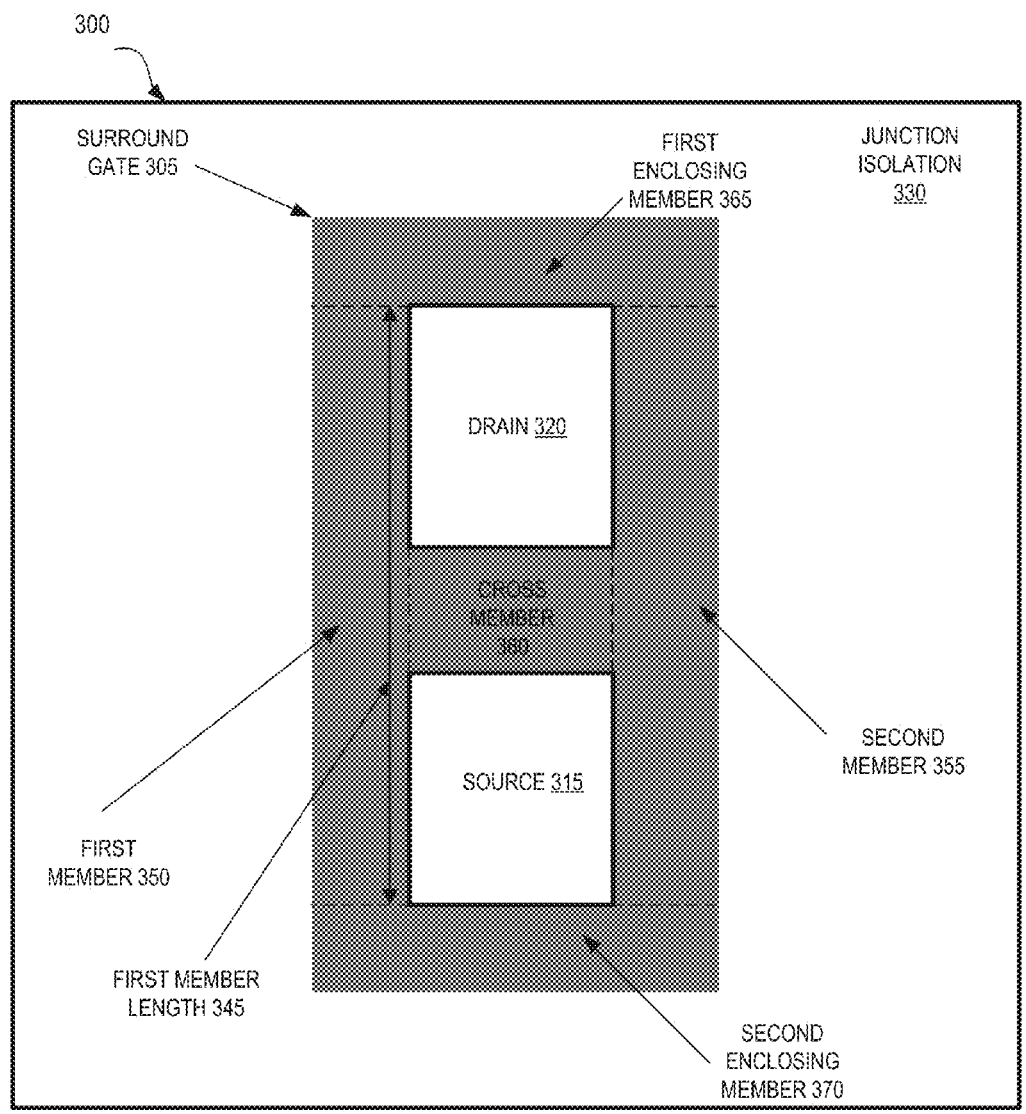
FIG. 3 is a plan view illustrating one example of a transistor gate shape, in accordance with an embodiment of the disclosure.

FIG. 3 is a plan view illustrating one example of a transistor gate shape, in accordance with an embodiment of the disclosure. Transistor 300 includes surround gate 305, source 315, drain 320, and junction isolation 330. Surround gate 305 includes first member 350, second member 355, cross member 360, first enclosing member 365, and second enclosing member 370. Surround gate 305 may be made from polysilicon. In the illustrated embodiment, surround gate 305 is made from a continuous piece of polysilicon and first member 350, second member 355, cross member 360, first enclosing member 365, and second enclosing member 370 are illustrated for description purposes. A conducting channel of transistor 300 is formed in the substrate between source 315 and drain 320 under cross member 360. Cross member 360 runs substantially perpendicular to the channel of transistor 300 and connects first member 350 and second member 355. Cross member 360 runs substantially perpendicular to first member 350 and second member 355 and is disposed above and between source 315 and drain 320. First enclosing member 365 runs substantially parallel to cross member 360 and connects first member 350 and second member 355. First member 350, second member 355, cross member 360, and first enclosing member 365 surround a cavity that is aligned above drain 320. Second enclosing member 370 runs substantially parallel to cross member 360 and connects first member 350 and second member 355. First member 350, second member 355, cross member 360, and second enclosing member 370 surround a cavity that is aligned above source 315. In the illustrated embodiment of FIG. 3, source 315 and drain 320 have a rectangular shape, though other shapes are possible. As mentioned above, the boundaries for source 315 and drain 320 may expand slightly from the illustrated boundaries due to diffusion.

The shape and placement of surround gate 305 may reduce the narrow width effect much the same as H-gate 205. For example, the channel of the transistor (which flows substantially under cross member 360), may not flow under the bottom edge of first member 350 or under the top edge of second member 355. Since these edges are offset from the channel, the narrow width effect that is a component of the isolation edge effect may be suppressed. The additional members of the surround gate 305 (first enclosing member 365 and second enclosing member 370) may also provide additional self-alignment function, as described below.

Figure 4:
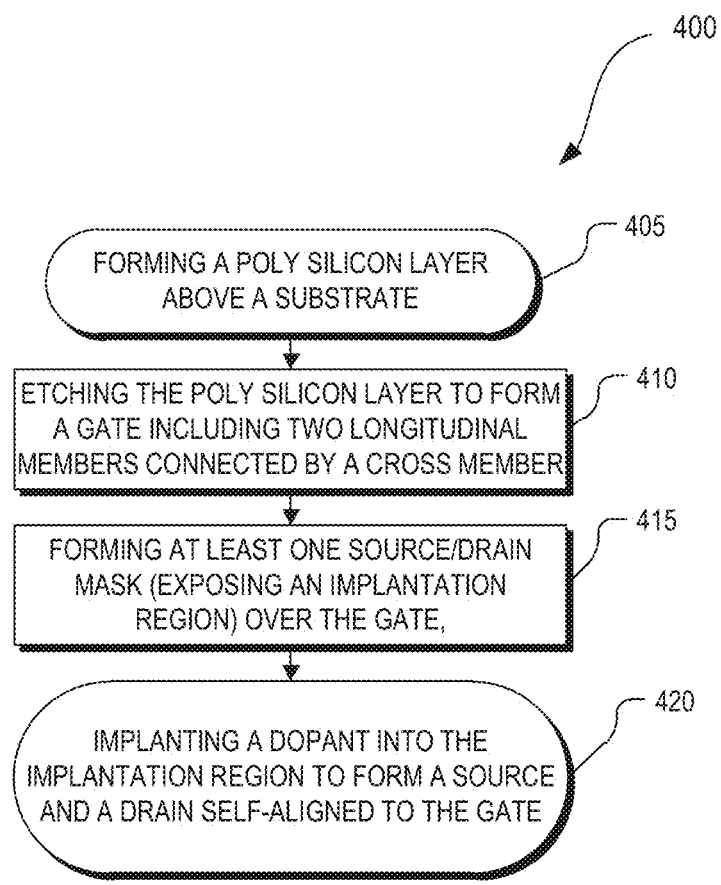
FIG. 4 is a flow chart illustrating a process for manufacturing a transistor, in accordance with an embodiment of the disclosure.
Figure 5A:
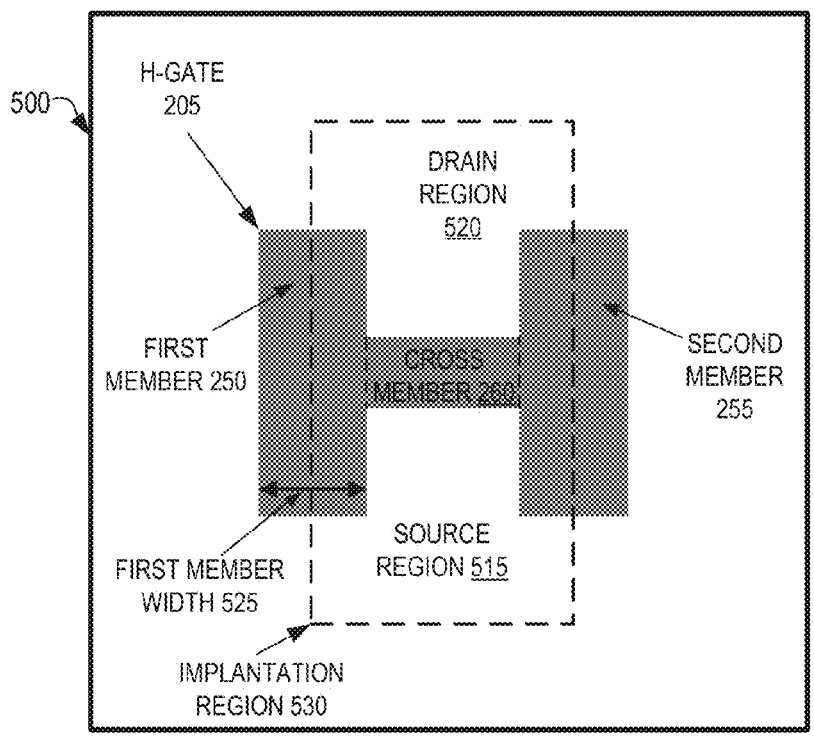
FIG. 5A is a plan view illustrating a gate and an implantation region, in accordance with an embodiment of the disclosure.
Figure 5B:
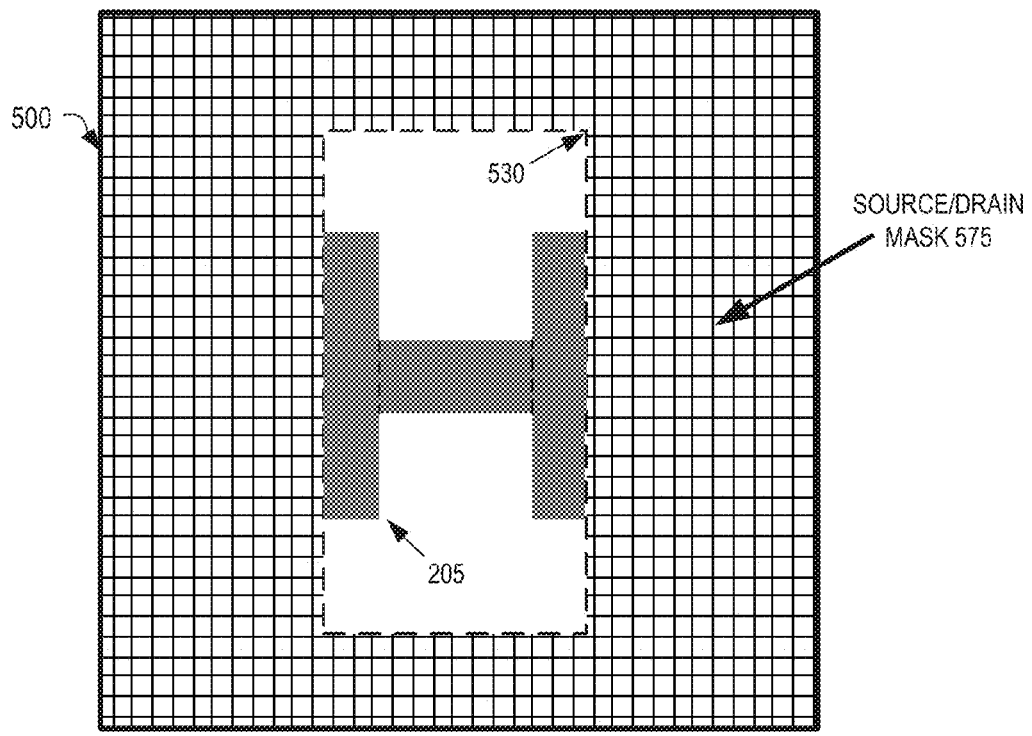
FIG. 5B is a plan view illustrating a mask, in accordance with an embodiment of the disclosure.

FIG. 4 is a flow chart illustrating a process 400 for manufacturing a transistor, in accordance with an embodiment of the disclosure. Process 400 is one example of how to fabricate transistor 200 or transistor 300. Process 400 is described in connection with FIGS. 5A, 5B, 6, 7, and 8. The order in which some or all of the process blocks appear in process 400 should not be deemed limiting. Rather, one of ordinary skill in the art having the benefit of the present disclosure will understand that some of the process blocks may be executed in a variety of orders not illustrated, or even in parallel.

In process block 405, a polysilicon layer is formed above a substrate. In process block 410, the polysilicon layer is etched to form a gate including two longitudinal members connected by a cross member. In one embodiment, the gate is shaped like H-gate 205. In another embodiment, the gate is shaped like surround gate 305. Other gate shapes that include two longitudinal members connected by a cross member are possible.

In process block 415, a source/drain mask (exposing an implantation region) is formed over the gate shape that was etched in process block 410. In process block 420, a dopant is implanted into the exposed implantation region to form a source and a drain that are self-aligned to the gate. In one embodiment, source/drain mask 575 (FIG. 5B) exposes implantation region 530 to implantation by masking the area outside implantation region 530. Implantation region 530 includes source region 515, drain region 520, a portion of first member 250 and second member 255, and the entire cross member 260. When the dopant is implanted, using an ion beam for example, some of the dopant is implanted into the substrate (into source region 515 and drain region 520), while some dopant will be implanted in the exposed portions of H-gate 205 and therefore not penetrate the substrate. Consequently, exposing portions of H-gate 205 to implantation allows the shape of H-gate 205 to function like a mask—it helps define the position of source region 515 and drain region 520 in the substrate. The result is that dopant is implanted in source region 515 and drain region 520 and aligned with, H-gate 205. Hence, the position of source/drain mask 575 over portions of H-gate 205 "self-aligns" source region 515 and drain region 520 to the shape of H-gate 205 by virtue of the implantation process. In one embodiment, source/drain mask 575 is omitted and the accuracy of the implantation combined with the mask function of H-gate 205 defines source region 515 and drain region 520.

With the shape of H-gate 205 functioning partially as a mask, a transistor width of transistor 500 may be defined by the distance between first member 250 and second member 255, instead of strictly by the accuracy of source/drain mask 575. Therefore, the vertical boundary of source/drain mask 575 exposing implantation region 530 need only be precise enough to fit within the confines of the width of first member 250 (illustrated in FIG. 5A as first member width 525) and second member 255, in order to have the shape of H-gate 205 define the width of the transistor. Since the tolerances of source/drain mask 575 can be relaxed, the expenses associated with more precise reticles (used in manufacturing transistors) may be reduced. Another advantage of having H-gate 205 function partially as a mask is that greater precision is available (relative to dopant implantation) in the etching process to form a shaped gate from a polysilicon layer. The greater precision due to etching the gate (e.g. H-gate 205) in combination with the gate functioning partially as a mask results in more precise source and drain placement.

In the above described embodiments, H-gate 205 may be exposed to ion implantation, and H-gate 205 may have the same dopant type as source region 515 and drain region 520. In other embodiments, source/drain mask 575 may be formed such that implantation region 530 only exposes source region 515 and drain region 520 to ion implantation. In other words, source/drain mask 575 may be formed to mask the entire H-gate 205 from ion implantation; as a result H-gate 205 may be undoped.

Figure 6:
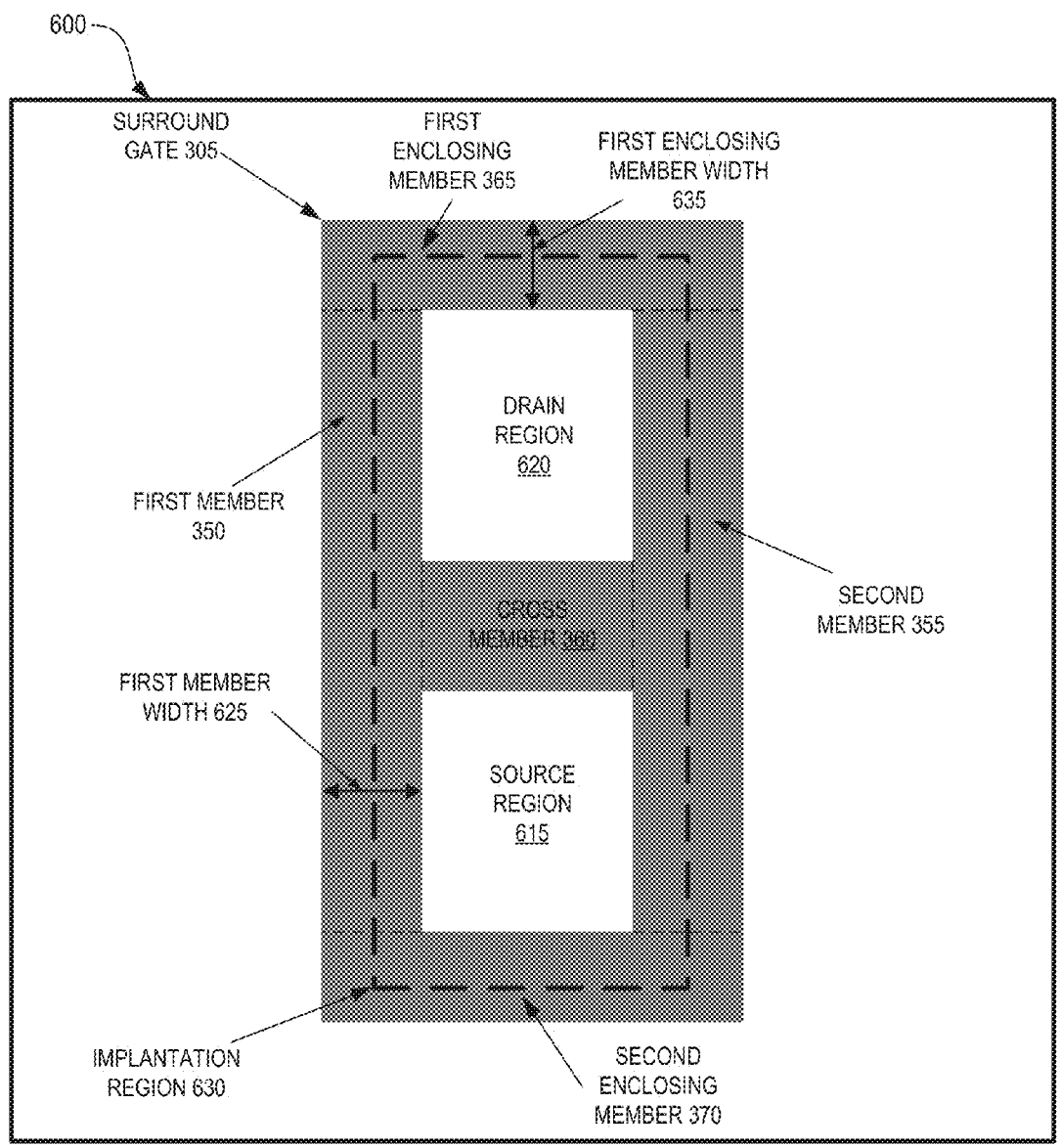
FIG. 6 is a plan view illustrating a gate and an implantation region, in accordance with an embodiment of the disclosure.

In FIG. 6, implantation region 630 is also an example of an implantation region in process block 415. Implantation region 630 may be exposed by a source/drain mask similar to source/drain mask 575. Implantation region 630 includes source region 615, drain region 620, a portion of first member 350 and second member 355, a portion of first enclosing member 365 and second enclosing member 370, and the entire cross member 360. Similar to H-gate 205, the shape of surround gate 305 may function partially like a mask. However, H-gate 205 only allows for relaxing the tolerances on the vertical boundaries source/drain mask 575. In contrast, surround gate 305 would allow for relaxed tolerances on the vertical and horizontal boundaries of a source/drain mask (exposing implantation region 630) because first enclosing member 365 and second enclosing member 370 help define source region 615 and drain region 620. Therefore, the tolerances of a source/drain mask exposing implantation region 630 can be relaxed according to first member width 625 and first enclosing member width 635. With surround gate 305 helping to define the illustrated vertical and horizontal boundaries of source region 615 and drain region 620, source region 615 and drain region 620 may be reduced in size, allowing for a smaller transistor 600. The benefits of surround gate 305 functioning partially as a mask in conjunction with a source/drain mask exposing implantation region 630 may also afford the benefits of inexpensive reticles, and more precise source and drain placement, as described above.

In the above described embodiments, surround gate 305 may be exposed to ion implantation, and surround gate 305 may have the same dopant type as source region 615 and drain region 620. In other embodiments, the source/drain mask may be formed such that only source region 615 and drain region 620 are exposed to ion implantation. In other words, the source/drain mask may be formed to mask the entire surround gate 305 from ion implantation.

Figure 7:
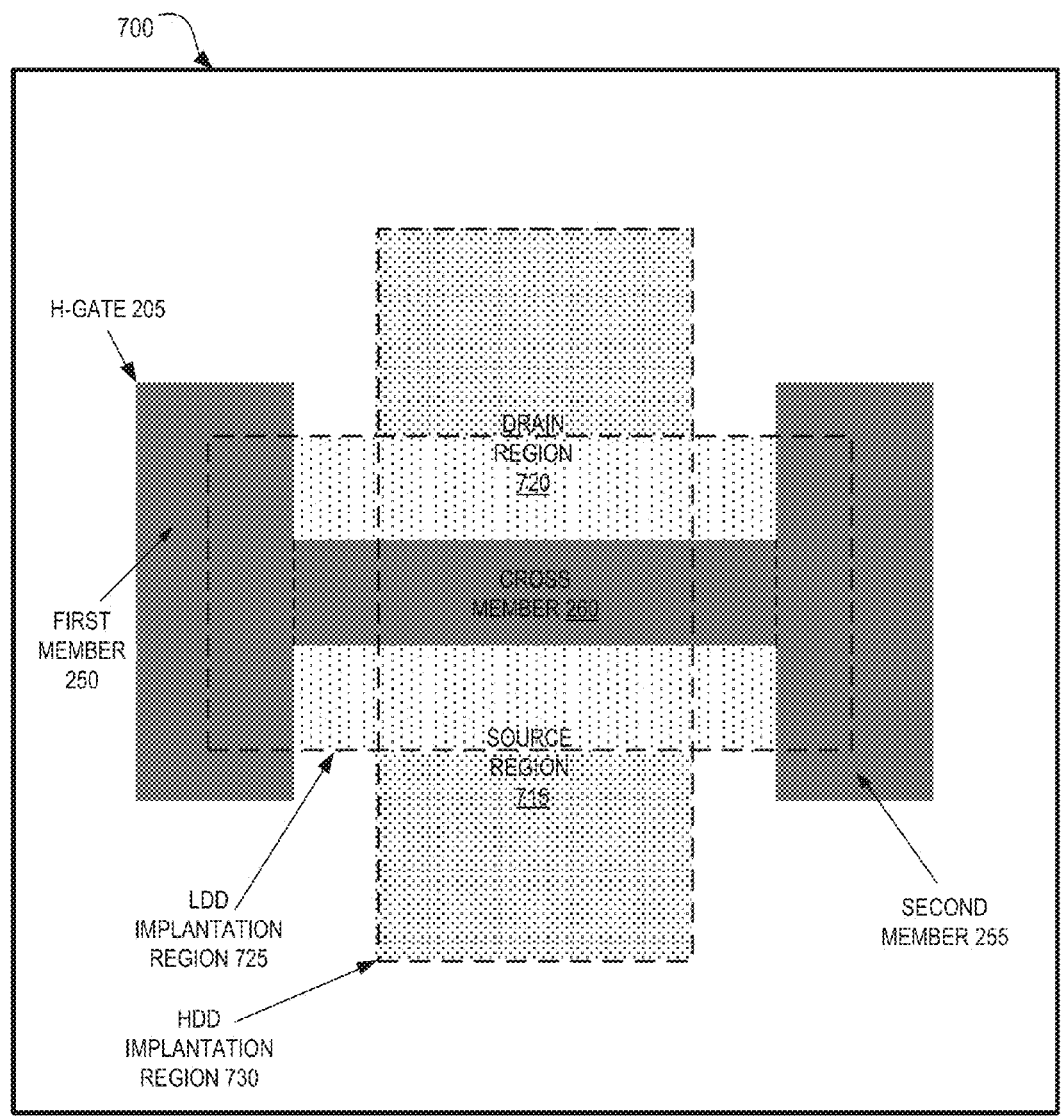
FIG. 7 is a plan view illustrating a gate and two implantation regions, in accordance with an embodiment of the disclosure.

FIG. 7 is a plan view illustrating a gate and two implantation regions, in accordance with an embodiment of the disclosure. Transistor 700 includes H-gate 205, source region 715, and drain region 720. LDD implantation region 725 illustrates where transistor 700 will be lightly doped. In one embodiment, an LDD mask exposes LDD implantation region 725. HDD implantation region 730 illustrates where transistor 700 will be highly doped. In one embodiment, a HDD mask exposes HDD implantation region 730. An LDD implant and an HDD implant will combine to form a source and a drain for transistor 700. LDD implantation region 725 and HDD implantation region 730 are examples of an implantation region referenced in process block 415. In one embodiment, an LDD mask exposing LDD implantation region 725 is formed first, a dopant is implanted into LDD implantation region 725, a spacer (which may be oxide or nitride) is formed around H-gate 205, a HDD mask exposing HDD implantation region 730 is formed, and dopant is implanted into HDD implantation region 730. If a spacer is formed around H-gate 205, it may cause the HDD implant to be offset from H-gate 205.

In the above described embodiments, H-gate 205 may be exposed to ion implantation, and may be exposed to both LDD implantation and HDD implantation. In other embodiments, the LDD and/or HDD mask may be formed to mask the entire H-gate from ion implantation.

Figure 8:
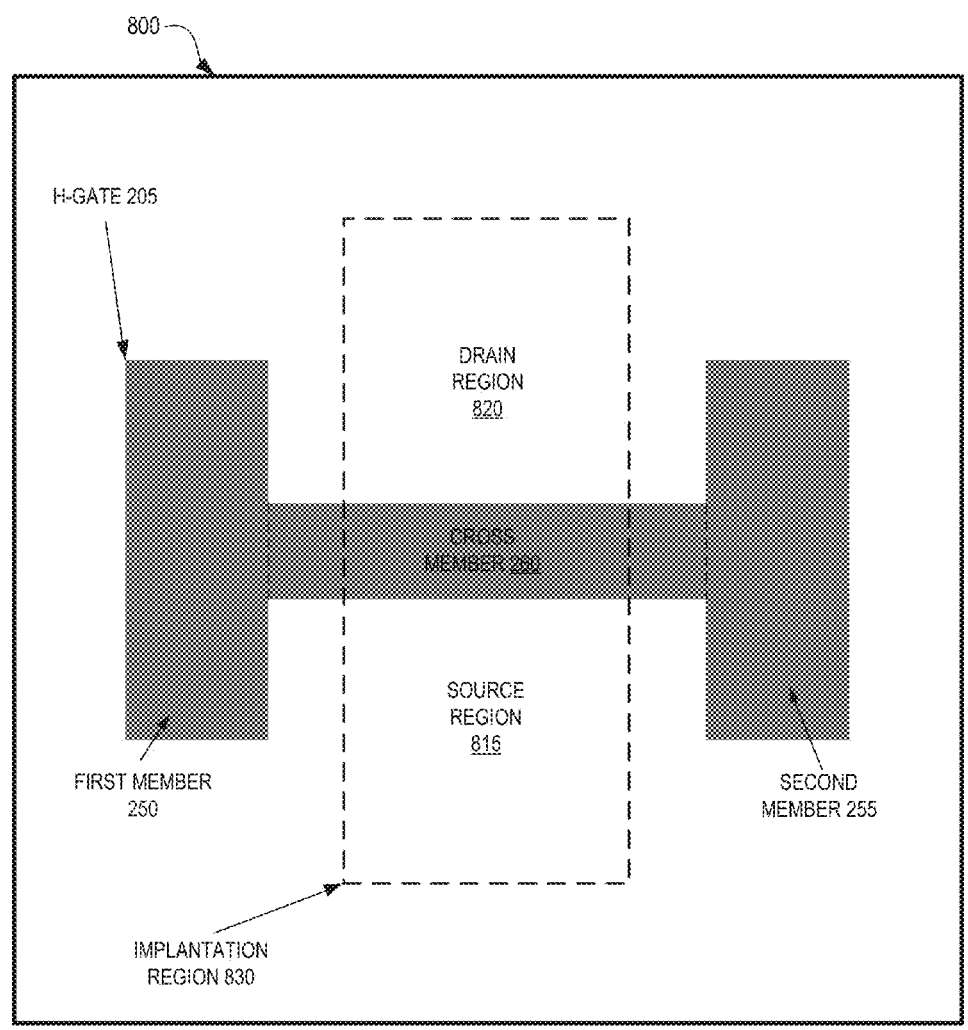
FIG. 8 is a plan view illustrating a gate and an implantation region, in accordance with an embodiment of the disclosure.

FIG. 8 is a plan view illustrating a gate and an implantation region, in accordance with an embodiment of the disclosure. Transistor 800 includes H-gate 205, source region 815, and drain region 820. In one embodiment, a source/drain mask exposes implantation region 830 to implantation. Implantation region 830 is not positioned over first member 250 or second member 255, but is positioned over cross member 260. Therefore, dopant implanted in source region 815 and drain region 820 will be self-aligned to the cross member, but may not be self-aligned with first member 250 and second member 255. However, once dopant is implanted into implantation region 830, the dopant may diffuse below first member 250 and second member 255. Additionally, if angled implantation methods are utilized, the boundaries of source region 815 and drain region 820 may be different than illustrated.

Figure 9:
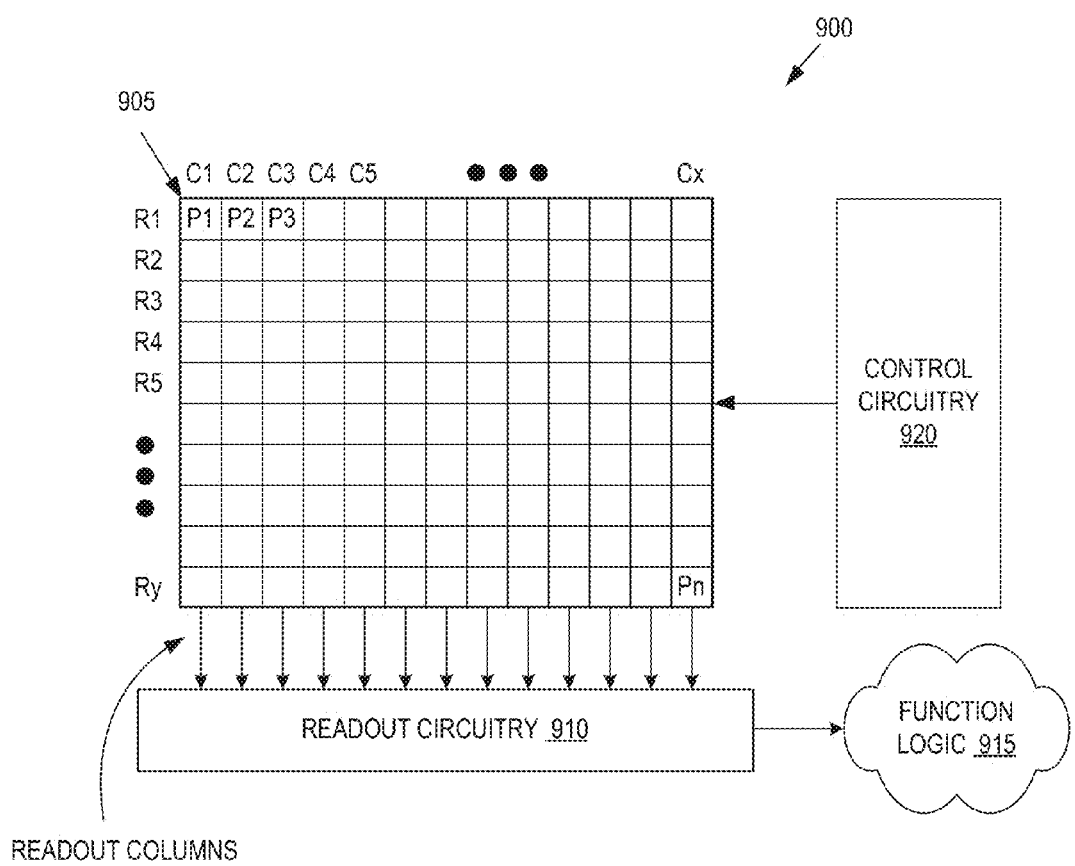
FIG. 9 is a functional block diagram illustrating an imaging sensor, in accordance with an embodiment of the disclosure.

FIG. 9 is a functional block diagram illustrating an imaging sensor 900, in accordance with an embodiment of the disclosure. The illustrated embodiment of imaging sensor 900 includes pixel array 905, readout circuitry 910, function logic 915, and control circuitry 920. Pixel array 905 is a two-dimensional ("2D") array of imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object. The transistor structures and processes in this disclosure may be used in imaging sensor 900. In one embodiment, transistor 200 may be included in imaging sensor 900 or in an image pixel in pixel array 905. In another embodiment, transistor 300 may be included imaging sensor 900 or in an image pixel in pixel array 905.

After each pixel has acquired its image data or image charge, the image data is read out by readout circuitry 910 and transferred to function logic 915. Readout circuitry 910 may include amplification circuitry, analog-to-digital ("ADC")

conversion circuitry, or otherwise. Function logic 915 may simply store the image data or even manipulate the image data by applying post image effects (e.g., crop, rotate, remove red eye, adjust brightness, adjust contrast, or otherwise). In one embodiment, readout circuitry 910 may readout a row of image data at a time along readout column lines (illustrated) or may readout the image data using a variety of other techniques (not illustrated), such as a serial readout or a full parallel readout of all pixels simultaneously. Control circuitry 920 is coupled to pixel array 905 to control operational characteristic of pixel array 905. For example, control circuitry 920 may generate a shutter signal for controlling image acquisition.

Figure 10:
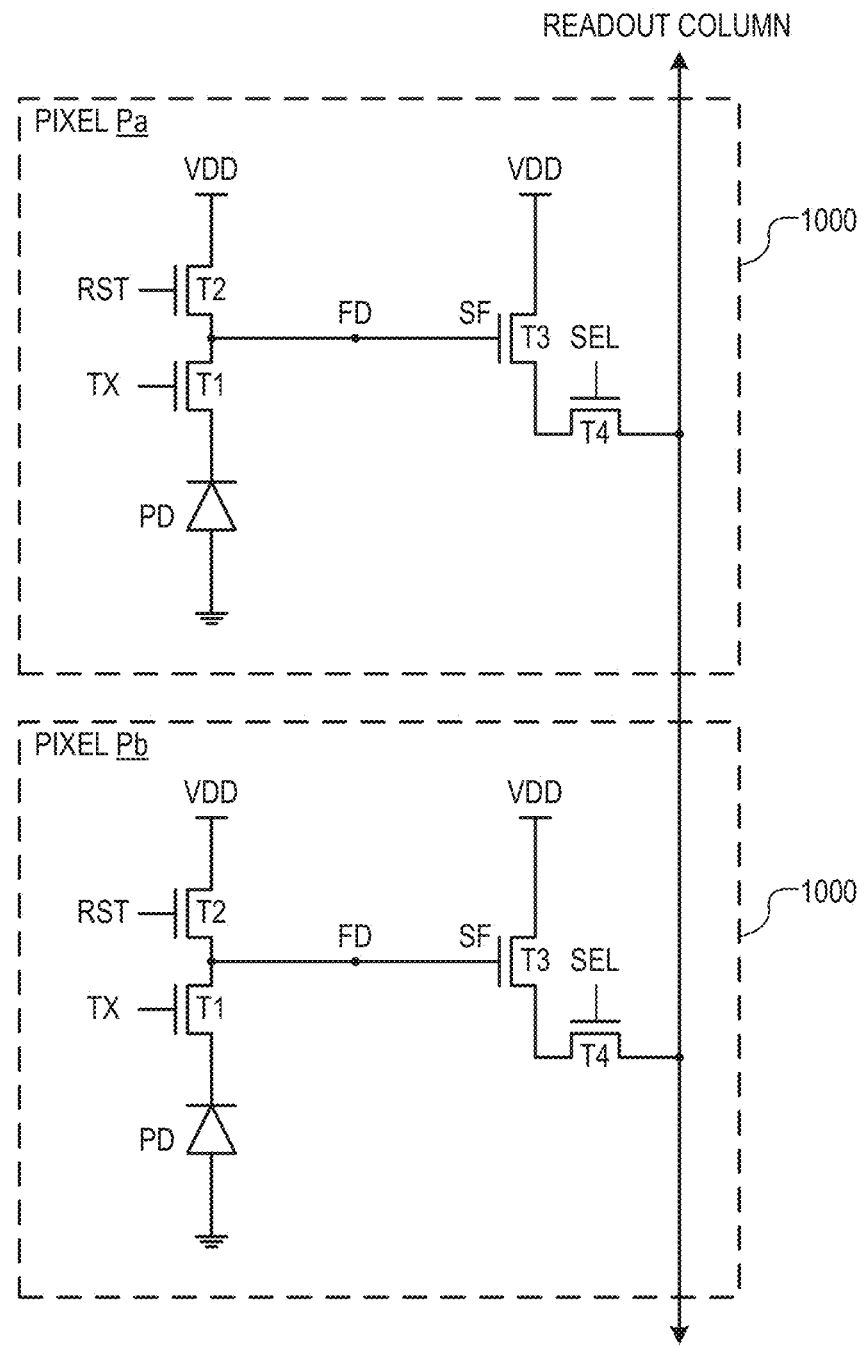
FIG. 10 is a circuit diagram illustrating sample pixel circuitry of two image sensor pixels within an image sensor, in accordance with an embodiment of the disclosure.

FIG. 10 is a circuit diagram illustrating sample pixel circuitry 1000 of two four-transistor ("4T") pixels within an imaging array, in accordance with an embodiment of the invention. Pixel circuitry 1000 is one possible pixel circuitry architecture for implementing each pixel within pixel array 905 of FIG. 9. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 10, pixels Pa and Pb are arranged in two rows and one column. The illustrated embodiment of each pixel circuitry 1000 includes photodiode PD, transfer transistor T1, reset transistor T2, source-follower ("SF") transistor T3, select transistor T4, and storage capacitor C1. During operation, transfer transistor T1 receives transfer signal TX, which transfers the charge accumulated in photodiode PD to floating diffusion node FD. In one embodiment, floating diffusion node FD may be coupled to a storage capacitor (not shown) for temporarily storing image charges.

Reset transistor T2 is coupled between power rail VDD and the floating diffusion node FD to reset the pixel (e.g., discharge or charge the FD and the PD to a preset voltage) under control of reset signal RST. Floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 1000 to the readout column line under control of select signal SEL. In one embodiment, the TX signal, the RST signal, and the SEL signal are generated by control circuitry 920. In one embodiment, every transistor in pixel circuitry 1000, except transfer transistor T1, will have the structure of transistors in this disclosure. For example, in one embodiment, reset transistor T2, SF transistor T3, and select transistor T4 will have the structure of transistor 200 (including H-gate 205). In one embodiment, reset transistor T2, SF transistor T3, and select transistor T4 will have the structure of transistor 300 (including surround gate 305), while transfer transistor T1 will have a conventional gate structure (e.g. gate 105). One reason transfer transistor T1 may have a conventional gate structure (e.g. gate 105) instead of a gate structure discussed in the disclosure (e.g. H-gate 205), is that a larger gate structure may block light directed toward the photodiode PD portion of transfer transistor T1.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A device comprising:
   a transistor comprising:
   a source and a drain disposed in a substrate, wherein the drain and the source are substantially T shaped; and
   a gate disposed above the substrate, wherein the gate includes:
   a first longitudinal member disposed above the source and the drain and running substantially parallel to a channel of the transistor, wherein the first longitudinal member is disposed over a first junction isolation region;
   a second longitudinal member disposed above the source and the drain and running substantially parallel to the channel of the transistor, wherein the second longitudinal member is disposed on an opposite side of the source and the drain as the first longitudinal member, and wherein the second longitudinal member is disposed over a second junction isolation region; and
   a cross member running substantially perpendicular to the channel of the transistor and connecting the first longitudinal member to the second longitudinal member, wherein the cross member is disposed above and between the source and the drain.

2. The device of claim 1, wherein a width of the channel of the transistor is the distance between the first longitudinal member and the second longitudinal member.

3. The device of claim 1, wherein at least a portion of the source and at least a portion of the drain is aligned below the cross member, an inside edge of the first longitudinal member, and an inside edge of the second longitudinal member.

4. An image sensor comprising an array of imaging pixels, each image pixel comprising:
   a photosensitive element for accumulating an image charge in response to light;
   a floating diffusion region to receive the image charge from the photosensitive element; and
   a transfer gate disposed between the photosensitive element and the floating diffusion region to selectively transfer the image charge from the photosensitive element to the floating diffusion region, wherein the floating diffusion region is coupled to a readout and a reset transistor, the readout and reset transistor each comprising:
   a source and a drain disposed in a substrate; and
   a gate disposed above the substrate, wherein the gate includes:
   a first longitudinal member disposed above the source and the drain and running substantially parallel to a channel of the transistor, wherein the first longitudinal member is disposed over a first junction isolation region;
   a second longitudinal member disposed above the source and the drain and running substantially parallel to the channel of the transistor, wherein the second longitudinal member is disposed on an opposite side of the source and the drain as the first longitudinal member, and wherein the second longitudinal member is disposed over a second junction isolation region; and a cross member running substantially perpendicular to the channel of the transistor and connecting the first longitudinal member to the second longitudinal member, wherein the cross member is disposed above and between the source and the drain, and wherein a distance between the first longitudinal member and the second longitudinal member defines a width of the channel of the transistor.

5. The image sensor of claim 4, wherein at least a portion of the source and the drain is aligned below the cross member, an inside edge of the first longitudinal member, and an inside edge of the second longitudinal member.

6. The image sensor of claim 4, wherein the gate further includes:

a first enclosing member running parallel to the cross member and connecting to the first longitudinal member and the second longitudinal member, wherein a drain cavity is disposed over the drain and surrounded by the first enclosing member, the cross member, and portions of the first and second longitudinal members; and a second enclosing member running parallel to the cross member and connecting to the first longitudinal member and the second longitudinal member on an opposite side of the first and second longitudinal member as the first enclosing member, wherein a source cavity is disposed over the source and surrounded by the second enclosing member, the cross member and portions of the first and second longitudinal members.

7. The image sensor of claim 6, wherein the drain cavity is aligned above the drain and the source cavity is aligned above the source.

8. The image sensor of claim 6, wherein a width of the channel of the transistor is the distance between the first longitudinal member and the second longitudinal member.

9. The device of claim 1, wherein the drain and the source extend beyond the length of the first and second longitudinal members, but the drain and the source do not extend beyond the width of the first and second longitudinal members.

10. An image pixel comprising:

a photosensitive element for accumulating an image charge in response to light;

a floating diffusion region to receive the image charge from the photosensitive element;

a transfer gate disposed between the photosensitive element and the floating diffusion region to selectively transfer the image charge from the photosensitive element to the floating diffusion region; and a transistor coupled to readout the image charge from the floating diffusion region, the transistor comprising:

a source and a drain disposed in a substrate; and a gate disposed above the substrate, wherein the gate includes:

a first longitudinal member disposed above the source and the drain and running substantially parallel to a channel of the transistor, wherein the first longitudinal member is disposed over a first junction isolation region;

a second longitudinal member disposed above the source and the drain and running substantially parallel to the channel of the transistor, wherein the second longitudinal member is disposed on an opposite side of the source and the drain as the first longitudinal member, and wherein the second longitudinal member is disposed over a second junction isolation region; and a cross member running substantially perpendicular to the channel of the transistor and connecting the first longitudinal member to the second longitudinal member, wherein the cross member is disposed above and between the source and the drain.

11. The image pixel of claim 10, wherein a transfer transistor includes the photosensitive element, the floating diffusion region, and the transfer gate, and wherein the gate of the transistor is included in any transistor of the image pixel, except the transfer gate of the transfer transistor.

\* \* \* \* \*